United States Patent [19]

Keim

[11] Patent Number: 4,581,580

[45] Date of Patent: Apr. 8, 1986

[54] INTENTIONALLY NON-ORTHOGONAL CORRECTION COILS FOR HIGH-HOMOGENEITY MAGNETS

[75] Inventor: Thomas A. Keim, Clifton Park, N.Y.

[73] Assignee: General Electric Company, Schenectady, N.Y.

[21] Appl. No.: 561,495

[22] Filed: Dec. 14, 1983

[51] Int. Cl.[4] .............................. G01R 33/20
[52] U.S. Cl. .................................. 324/318; 324/320
[58] Field of Search ............. 324/318, 309, 300, 319, 324/320, 322; 335/216, 299; 376/142

[56] References Cited

U.S. PATENT DOCUMENTS

| | | | |
|---|---|---|---|
| 3,287,630 | 11/1966 | Gang | 324/320 |
| 3,569,823 | 3/1971 | Golay | 324/320 |
| 4,231,008 | 10/1980 | Krueger | 324/320 |
| 4,339,718 | 7/1982 | Bull | 324/319 |
| 4,456,881 | 6/1984 | Compton | 324/319 |
| 4,486,711 | 12/1984 | Frese et al. | 324/319 |
| 4,509,030 | 4/1985 | Vermilyea | 324/320 |

FOREIGN PATENT DOCUMENTS

0073402 8/1982 European Pat. Off. .
2840178 3/1980 Fed. Rep. of Germany .
3131946 3/1983 Fed. Rep. of Germany .

Primary Examiner—Michael J. Tokar
Attorney, Agent, or Firm—Lawrence D. Cutter; James C. Davis, Jr.; Marvin Snyder

[57] ABSTRACT

In the design of large electromagnets having high magnetic field uniformity requirements it is common practice to employ a set of correction coils and coil circuits, each coil being excited so as to correct for a specially defined, symmetrically shaped error field. The error field is typically defined as certain terms in a spherical harmonic expansion for the field. The present invention proposes instead to provide a set of correction coil circuits in which the creation of a desired spherical harmonic is achieved by exciting a set of correction coils with a specified set of currents, and in which the same coils can further be used to create a spherical harmonic of substantially different symmetry by exciting the same coils with a different set of currents. In the present invention, a linear combination of spherical harmonic components may be effected, so as to increase the flexibility of operation and the correction capability of the magnet and correction coil structure.

6 Claims, 6 Drawing Figures

θ - INDEX, n

|   | 0 | 1 | 2 | 3 | 4 | 5 | 6 | 7 | 8 | 9 |   |
|---|---|---|---|---|---|---|---|---|---|---|---|
| | φ | φ,θ | φ | φ,θ | φ | φ,θ | φ | φ,θ | φ | φ,θ | 0 |
| | | | θ | X | θ | | θ | | θ | | 1 |
| | | | | φ | φ,θ | φ | φ,θ | φ | φ,θ | φ | φ,θ | 2 |
| | | | | | A | A,θ | A | A,θ | A | A,θ | A | 3 |
| | | | | | | φ | φ,θ | φ | φ,θ | φ | φ,θ | 4 |
| | | | | | | | | θ | | θ | | 5 |
| | | | | | | | | A,φ | A,θ,φ | A,φ | A,θ,φ | 6 |
| | | | | | | | | | | θ | | 7 |
| | | | | | | | | | | φ | φ,θ | 8 |
| | | | | | | | | | | | A | 9 |

φ - INDEX, m

LEGEND

- φ: HARMONIC ELIMINATED BY φ SYMMETRY
- θ: HARMONIC ELIMINATED BY θ SYMMETRY
- A: HARMONIC ELIMINATED BY SELECTION OF 120° ARC LENGTH
- X: HARMONIC ELIMINATED BY SELECTION OF Z DIMENSIONS

FIG.3

θ-INDEX, n

|   | 0 | 1 | 2 | 3 | 4 | 5 | 6 | 7 | 8 | 9 |   |
|---|---|---|---|---|---|---|---|---|---|---|---|
|   | φ | φ | φ | φ | φ | φ | φ | φ | φ | φ | 0 |
|   |   |   |   | x |   |   |   |   |   |   | 1 |
|   |   |   | φ | φ | φ | φ | φ | φ | φ | φ | 2 |
|   |   |   |   | A | A | A | A | A | A | A | 3 |
|   |   |   |   |   | φ | φ | φ | φ | φ | φ | 4 |
|   |   |   |   |   |   |   |   |   |   |   | 5 |
|   |   |   |   |   |   |   | φ,A | φ,A | φ,A | φ,A | 6 |
|   |   |   |   |   |   |   |   |   |   |   | 7 |
|   |   |   |   |   |   |   |   |   | φ | φ | 8 |
|   |   |   |   |   |   |   |   |   |   | A | 9 |

φ-INDEX, m

LEGEND

φ: HARMONIC ELIMINATED BY φ SYMMETRY
A: HARMONIC ELIMINATED BY SELECTION OF 120° ARC LENGTH
X: HARMONIC ELIMINATED BY SELECTION OF Z DIRECTION

FIG. 4

LEGEND

X: HARMONIC ELIMINATED BY SELECTION OF z DIMENSIONS
A: HARMONIC ELIMINATED BY SELECTION OF 120° ARC LENGTH

INTENTIONALLY NON-ORTHOGONAL CORRECTION COILS FOR HIGH-HOMOGENEITY MAGNETS

BACKGROUND OF THE DISCLOSURE

The present invention relates to a magnet structure for producing a high strength, high homogeneity magnetic field. More particularly, the present invention is related to the design and construction of electromagnets useful for whole-body, nuclear magnetic resonance (NMR) imaging systems, especially such systems for medical diagnostic applications.

In the generation of tomographic and planar images and other data from NMR imaging devised, it is necessary to have a high strength and high uniformity magnetic field. In NMR systems for whole-body medical diagnostic imaging, the magnetic field strengths typically range from about 0.04 to about 1.5 Tesla, or more. In order to reduce geometric distortion and to prevent other undesirable artifacts in the image or data, and also to limit the power required in the gradient and radio frequency coils, it is also necessary that the main magnetic field exhibit a high degree of field strength uniformity. The main magnetic field $B_o$ for NMR imaging is typically produced by a set of one or more principal coils disposed on a cylindrical surface. These coils may be either resistive or superconductive. Additionally, permanent magnets may also be employed to generate the principal magnetic field component $B_o$. It is further convenient that this magnetic field be oriented in an axial direction with respect to the cylinder on which the coils are disposed. Ideally, this condition should hold throughout the cylindrical volume.

However, whether resistive, superconductive or permanent magnets are employed, it is necessary to build the magnet to a carefully specified configuration and to strive to minimize deviations from the specified shape due to manufacturing variability. However, even when extraordinary steps are taken to ensure proper construction and magnetic field uniformity, a residual field error remains. Accordingly, it is conventional practice to employ relatively low power correction coils to perturb the field in a manner which increases the overall field uniformity.

Because field errors arise from uncontrollable deviations of the magnet or from unpredictable variablility in the magnetic boundary, the size and shape of the perturbation required of the correction coils cannot be predicted before magnet construction. Accordingly, correction coils are generally employed to produce a field which is adjustable both in magnitude and shape so as to achieve the formation of a correction field leading to a more uniform overall (net) field.

In describing the field within the cylindrical volume of interest, experimenters in the field of NMR imaging have almost universally employed a spherical coordinate system together with a series of spherical harmonic functions indexed by two parameters to describe the field within the cylinder. More particularly, it is known to employ correction coils which are specifically chosen so that each correction coil circuit produces a field with a shape corresponding approximately to one of the terms in the set of spherical harmonic functions. Since the set of spherical harmonic functions is orthogonal over the region of interest, correction coil design is therefore greatly simplified. In particular, since the functions are orthogonal each correction coil circuit may be designed to correct for a single term in the expansion describing the error field. Therefore, such correction coils have the desirable property that adjustment of one correction coil circuit is nearly independent of the adjustment of any other circuit. However, the disadvantage of such correction coils is that the configuration of coils required to achieve this end can be more complicated than is necessary to achieve a specified minimum error condition. In the spherical harmonic expansions which are employed for correction coil design, the number of physically distinct coils in a circuit increases very rapidly with the order of the highest harmonic term for which correction is desired. The reason for this rapid increase in the number of coils is that the spacial structure for the higher order spherical harmonic functions is substantially more complicated.

However, it is the purpose of this invention to achieve the capability of adjusting many parameters of the field shape with a set of correction coils the structure of which is much simpler than a set of coils designed to act separately on each spherical harmonic function to be corrected.

SUMMARY OF THE INVENTION

In accordance with a preferred embodiment of the present invention a correction coil for use in magnet structures comprises a plurality of coil windings which are disposed and interconnected so that excitation of the windings with a set of currents having substantially equal magnitudes and a first selected set of current directions or polarities is such that these winding contribute substantially to only a single term of the spherical harmonic expansion of the axial component of the magnetic field in the volume within the correction coils. Furthermore, the windings are so disposed and interconnected that selected different current polarities contribute substantially to a different single term of the spherical harmonic expansion of the axial component of the magnetic field produced by the correction coil in the interior volume. Furthermore other selections of current polarities may be made to effect contributions to the axial component of the magnetic field which are linear combinations of selected terms in the spherical harmonic expansion of the magnetic fields reproduced by the coil.

More particularly, in one embodiment of the present invention the correction coil windings are disposed so as to contribute substantially only to the (1,1) (2,1) and (4,1) terms in the spherical harmonic expansion of the actual component of the magnetic field. However, it should be generally understood in the present invention that error correction is more important in an a radially and axially central region within the coil volume. This reduced volume in which the field homogeneity is more important generally corresponds to a central, disc-shaped volume within the patient or object being studied.

Accordingly, it is an object of the present invention to provide correction coils for magnet structures which are particularly useful in whole-body, NMR medical diagnostic imaging.

It is also an object of the present invention to provide a magnet structure exhibiting a high homogeneity magnetic field.

It is a still further object of the present invention to provide correction coils which are intended to correct for more than single terms in the spherical harmonic expansion representing the error field, the error field being a departure from uniformity in the axial component of the magnetic field.

DETAILED DESCRIPTION OF THE INVENTION

The present invention cannot be fully appreciated without an understanding that the axial component $B_z$ of the magnetic field in a spherical volume may be described in terms of a series of spherical harmonic functions as follows:

$$B_z = B_o + \sum_{n=1}^{\infty} r^n (A_n P_{no}(\theta) + \sum_{m=1}^{n} P_{nm}(\theta)(B_{nm}\cos(m\phi) + C_{nm}\sin(m\phi))) \quad (1)$$

where $P_{nm}(\theta)$ is an associated Legendre function which is related to the well-known Legendre polynomials $P_{no}(\theta)$. The associated Lagendre functions $P_{nm}(\theta)$ are provided in Table I below for values of n and m up to four. It should be noted in the expansion above that the functions $P_{nm}(\theta)$ are defined only for $n \geq m$.

TABLE I $P_{11}(\theta) = \sin\theta$ $P_{21}(\theta) = \frac{3}{2}\sin 2\theta$ $P_{22}(\theta) = \frac{3}{2}(1 - \cos 2\theta)$ $P_{31}(\theta) = \frac{3}{8}(\sin\theta + 5\sin 3\theta)$ $P_{32}(\theta) = \frac{15}{4}(\cos\theta - \cos 3\theta)$ $P_{33}(\theta) = \frac{15}{4}(3\sin\theta - \sin 3\theta)$ $P_{41}(\theta) = \frac{5}{16}(2\sin 2\theta + 7\sin 4\theta)$ $P_{42}(\theta) = \frac{15}{16}(3 + 4\cos 2\theta - 7\sin 4\theta)$

Figure 1:
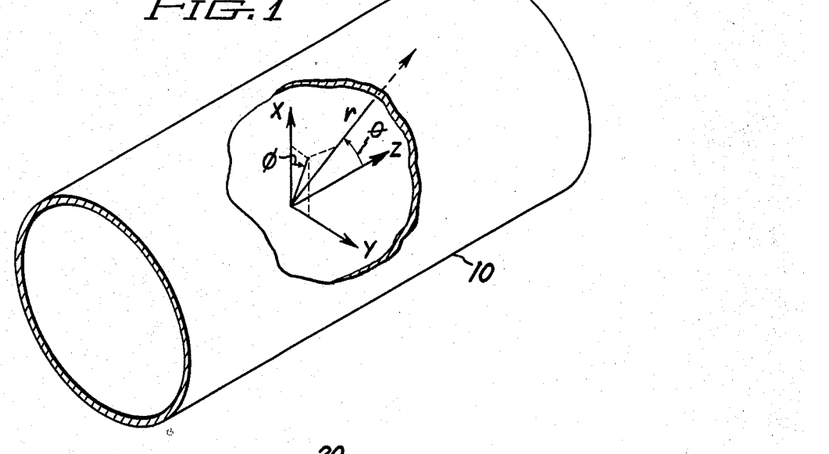
FIG. 1 is an isometric view illustrating a spherical coordinate system in a cylindrical volume so as to more readily identify terms in the spherical harmonic expansion of the axial component of a magnetic field defined within the volume.
Figure 2:
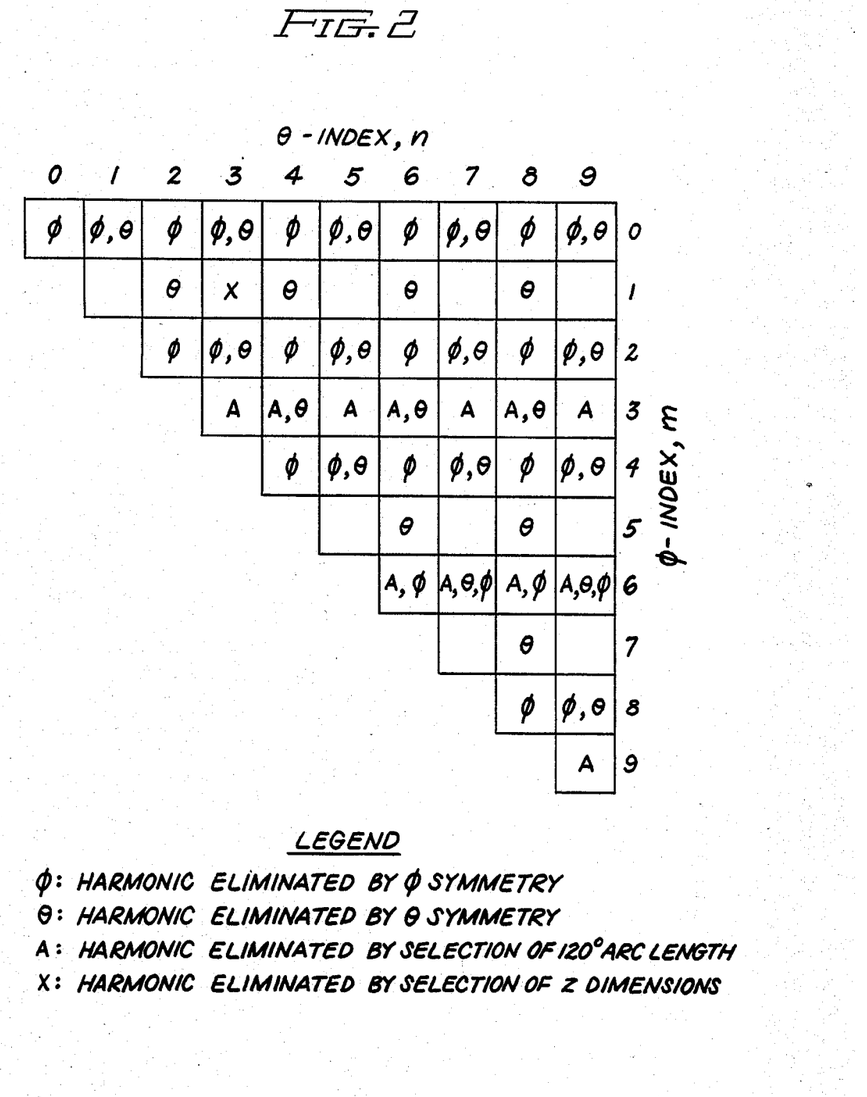
FIG. 2 is a chart illustrating various spherical harmonic expansion components associated with (1,1) correction coils of the type includable in an NMR magnet.
Figure 5:
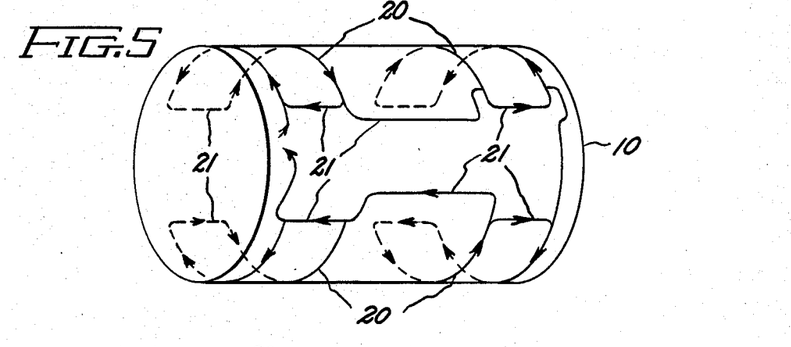
FIG. 5 is an isometric, parially schematic view illustrating current conventional practice in correction coils design, particularly showing coil placement layout and current direction.

TABLE I-continued $P_{43}(\theta) = \frac{105}{8}(2\sin 2\theta - \sin 4\theta)$ $P_{44}(\theta) = \frac{105}{8}(3 - 4\cos 2\theta + \cos 4\theta)$ FIG. 5 shows a schematic diagram of a four coil circuit arrangement as conventionally wound on the surface of cylinder 10. The coils form a single electrical circuit 20 in which the direction of current in each coil and the direction of the connections among the members of the coil set are shown. In particular, it is to be noted that axial current flow on the surface of the cylinder (such as in conductor segment 21) does not contribute to components of $B_z$. The correction coils shown in FIG. 5 are disposed so as to have mirror image symmetry about the z axis and also to have $\cos\phi$ symmetry in the $\phi$ direction. The coils are also constructed with an arc angle of 120° in the $\phi$-direction. Additionally, the axial locations of the segments of coil 20 are selected to eliminate contributions to the (3,1) term of the spherical harmonic expansion. That is to say, the term of the expansion with n=3, m=1 is zero for the coil configuration shown in FIG. 5. Other symmetry properties of the coil system of FIG. 5, with regard to which terms of the spherical harmonic expansion may be eliminated, are illustrated in FIG. 2. FIG. 2 is a chart illustrating the various coefficients of the spherical harmonic terms of the expansion which can be eliminated through proper design and positioning of the coils shown in FIG. 5. In particular the boxes which have no entry represent those terms which have not been eliminated. Additionally, each box indicates a specified symmetry mechanism for elimination of that particular term. Each "$\phi$" in the table for example indicates that the particular term represented by that box can be eliminated by selecting a coil with $\phi$ symmetry of appropriate periodicity. Similarly, those entries in the chart of FIG. 2 in which a Greek letter "$\theta$" is present in a box indicates that that particular term of the spherical harmonic expansion has been eliminated by the periodicity of the $\theta$-symmetry. As the legend also indicates, the box in the chart having a letter X indicates that that particular term in the harmonic expansion can be eliminated by appropriate selection of axial dimensions, in particular, by the positioning of the arcuate sections of the correction coil in an axial direction. For example, the coil arrangement of FIG. 5 has three factors, any one of which would eliminate the (7,6) term: $\phi$-symmetry, $\theta$-symmetry and use of 120° arc-length coil sections.

It is apparent from inspection of FIG. 2 that the magnetic field created by the coil configuration of FIG. 5 is very nearly purely that corresponding to the (1,1) harmonic term. The only contaminants in the range of indices covered by FIG. 2 are the (5,1), (7,1), (9,1), (5,5), (7,5), (9,5), (7,7), and (9,7) harmonic expansion terms.

Figure 3:
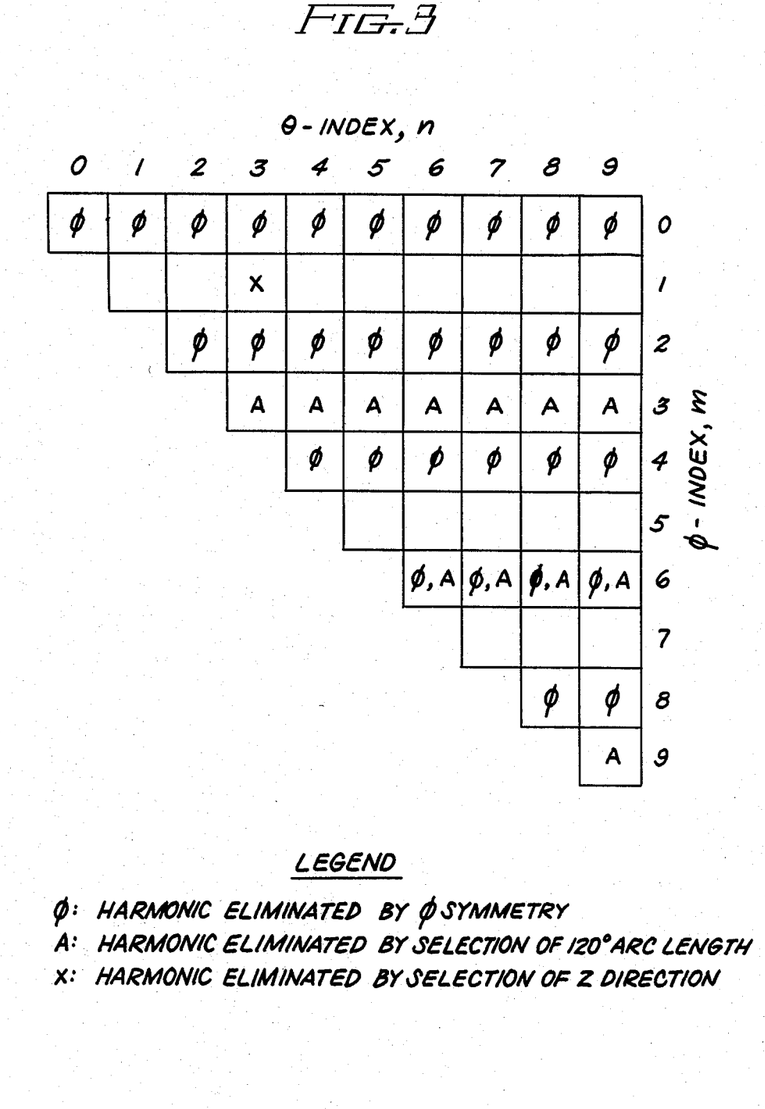
FIG. 3 is a table illustrating spherical harmonic expansion components for a revised coil connection in which no $\theta$-symmetry is present.
Figure 6:
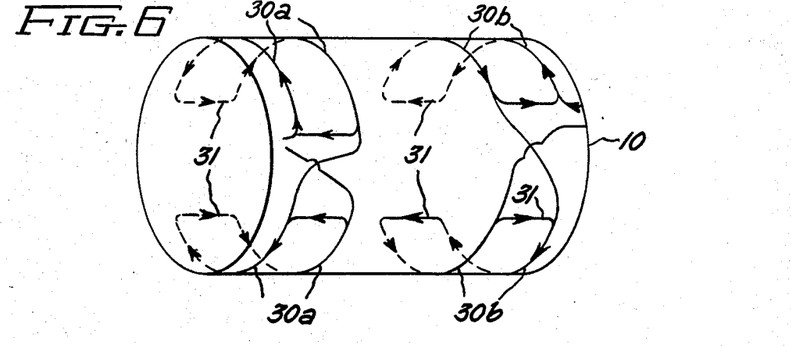
FIG. 6 is an isometric view illustrating the placement of correction coils in accordance with an embodiment of the present invention.

However, attention is now directed to the coil configuration of FIG. 6 which is a modification of the coil shown in FIG. 5. In FIG. 6, the left half and right half of the circuit of FIG. 5 have been divided into separate circuits. The only practical complication of the improved device shown in FIG. 6 is the need to provide an extra set of leads and necessary hardware for controlling the extra circuit. FIG. 3 indicates the harmonics that are present in the field due to the coil circuit of FIG. 6 in which the currents in the two circuits are neither necessarily equal nor equal and opposite (that is, they are without θ-symmetry). The principal benefit to be gained from the connection shown in FIG. 6 is the ability of the coil set to make a contribution to the (2,1) term in addition to its contribution to (1,1) term. By comparing FIGS. 2 and 3 it can be seen that the penalty incurred for this extra flexibility is primarily the existence of a (4,1) term. Other less important terms excited by this circuit, but not by the circuit of FIG. 5, include the (6,1), (8,1), (6,5), (8,5), and (8,7) terms. In each ordered pair, the θ index is the first element.

It should also be indicated herein that harmonic contaminants beyond N=5 are generally not thought to be a significant problem in the construction of magnets producing highly uniform fields.

The magnitude of the penalty paid for the introduction of certain higher order harmonics is small compared to the benefit of the extra adjustability and flexibility provided. Firstly, the extra contaminants, principally the (4,1) and the (6,1) terms, etc. exist only to the extent that the capability to adjust for the (2,1) term is employed. Furthermore, if the currents in the two circuits are balanced, no even n components are generated. Furthermore, the extra freedom does not have to be viewed as a control to adjust the (2,1) term which has (4,1) and higher contaminants. Rather, it can be operated as a control which excites a linear combination of (2,1), (4,1) and similar terms. The setting which maximizes the field homogeneity subject to that constraint can be determined. This setting is in general better than the one which forces the (2,1) term to zero. Finally, use of the capability to adjust the (2,1) term and its associated harmonics does not increase the level of the (5,1), (7,1), and other contaminants associated with the (1,1) coil, beyond that created by the original (1,1) coil; the θ-symmetry of the difference current is such that no odd n components are generated.

Other combinations of two coils in series are possible, but they involve both relaxing the φ-symmetry condition as well as the θ-symmetry condition. The net effect is a set of coils with only two adjustable parameters but with much more harmonic contamination than the set shown in FIG. 6.

Figure 4:
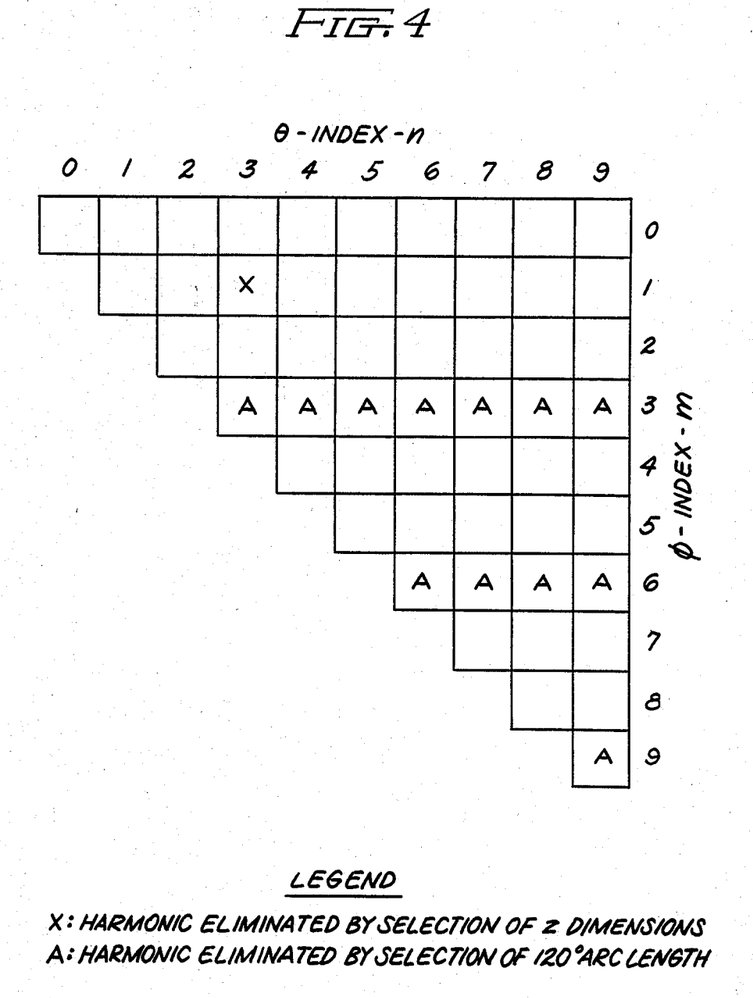
FIG. 4 is a chart similar to FIGS. 2 and 3 illustrating the spherical harmonic components which are present in the case of the four individual correction coils.

Another remaining case of interest is the one in which each of the four coils of the set shown in FIG. 6 is porvided with its own separate leads and excitation source. The table of harmonics present is now much fuller. This point is illustrated in the chart of FIG. 4. However, there are now four independent adjustments. It should now be possible to reduce the (1,1) (2,1), (2,2), and (3,2) harmonic components to zero. For example, coils 30a and 30b in FIG. 6 could each be divided into a pair of separately driven coils to accomplish this result. The inclusion of additional harmonics is subject to exactly the same sort of considerations as in the case of the two coil connection of FIG. 6. The harmonics associated with each of the adjustments is only a subset of the total possible and they are present only if, and to the extent that, the additional adjustment capability is exploited. If the design requires a pure (1,1) adjustment, four individual coils can achieve this adjustment with the same degree of harmonic purity as the original connection in FIG. 5. If only (1,1) and (2,1) terms are required to be adjusted, the four coil set derived from FIG. 6 as discussed above can be equally well employed. However, extra flexibility is available in a four circuit arrangement and can in general be used to improve homogeneity over the level attainable by constraining combinations of coils to have the same current.

It should be noted that the four circuit arrangement in general does excite n=0 harmonics. This, however, is not of significant concern since it is generally true that axial correction coils are provided.

In the example above, the benefits of a two coil circuit arrangement over the original (1,1) connection of FIG. 5 are achieved at a very minor sacrifice in terms of increased complexity. The proposed modifcaction is practical in the sense that the (1,1) response is related to the average of the current in the two circuits and the (2,1) response is related to the difference between the currents.

In the case of four separate circuits, the practicality of the proposed change may not, however, be as apparent. All of the benefits claimed are formally achievable, however, although it is not as apparent that the results are as easily achieved in practice.

In light of all of the other deviations from the goals of the original (1,1) correction coil set, it may be appropriate to relax the requirement to produce no (3,1) harmonic terms. The axial location of the coil sides may then be varied to achieve some other condition. For example, location of the coil sides could be chosen to minimize some weighted combination of the amount of (3,1) harmonic produced when adjusting for the (1,1) harmonic and the amount of (4,2) harmonic produced when adjusting for the (2,2) harmonic.

The potential benefits of the four circuit arrangement are nontheless significant. For example, a set of two such circuits, displaced between 45° and 60° is able to adjust both components of the (1,1) harmonic field, the (2,2) harmonic field, the (2,1) harmonic field and the (3,2) harmonic field. Auxiliary power supplies for the adjustment of eight circuits are required but this is the minimum required to adjust both the sin(mφ) and cos(mφ) terms of four different harmonics, no matter what circuit is employed. Compared to a set of saddle coils designed to produce only (1,1) terms and a second set designed only to produce (2,2) terms, such a configuration can correct twice as many harmonics and it can do so with one-third the number of saddle coils. If the 120° included angle were relaxed to 90° it is possible to put all eight saddle coils on a single cylinder.

It should be noted however that the discussion above is meant only to serve as one example of the benefits which are achievable by providing individual coils or small subgroups of coils each with separately accessible leads that are separately adjustable. In particular, subdividing the axial correction coils into a greater number of circuits permits the same quantity of wire to be used to correct many more harmonics than can be affected by existing connections. Alternatively, a set of axial coils working on all orders through 4 is achievable with only four solenoidal coils, that is, circular as opposed to saddle coils.

Apart from the complexity of providing leads and auxiliary driving circuitry for each new circuit, the principal drawback of the present invention is that settings of the coil currents to achieve any given end cannot be as conveniently determined from the measured field errors as in the case of orthogonal or nearly orthogonal terms. However, the information required to determine such settings is no greater than that required to determine the current level in the coils in prior designs. In particular, it is only needed to know the contribution of a current in any coil to each of the first several spherical harmonic components.

While the invention has been described in detail herein, in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A correction coil set for use in magnet structures, for providing a uniform magnetic field within a volume located centrally with respect to said coil set, said correction coil set comprising a plurality of coil windings, said windings being so disposed and interconnected that electrical excitation of said windings, with a set of currents having substantially equal magnitudes and first select polarities, contributes substantially to a single term of the spherical harmonic expansion of the axial component of the magnetic field in said volume produced by said correction coil set, said windings also being disposed and interconnected electrical excitation of said windings, with currents having substantially the same magnitudes and selected different polarities, contributes substantially to a different single term of the spherical harmonic expansion of the axial component of the magnetic field, in said volume, produced by said correction coil set.

2. The correction coil set of claim 1 in which said selected different current polarities comprises the set of opposite polarities for exciting a different single term of the spherical harmonic expansion of said axial component.

3. The correction coil set of claim 1 in which said coil windings are so disposed and interconnected that excitation of said windings with a set of currents having said first selected polarities contributes substantially to the single (l,m) term of the spherical harmonic expansion of said axial component and excitation of said windings with currents having substantially the same magnitudes and opposite current polarity, contributes substantially to the single (n,m) term of the spherical harmonic expansion of said axial component, wherein l is an even integer and n is an odd integer and m is any integer such that $m \leq n$ and $m \leq l$.

4. The correction coil set of claim 1 in which said coil windings are disposed on the surface of a cylinder.

5. The correction coil set of claim 4 in which said coil windings comprise a plurality of saddle-shaped windings disposed on said cylindrical surface in mirror image symmetry about a plane orthogonal to and bisecting the longitudinal axis of said cylindrical volume, said windings on opposite sides of said plane being independently electrically excitable.

6. A correction coil set comprising first and second pairs of electrically interconnected coil windings wound in a cylindrical configuration, each pair being electrically isolated from the other, said coils exhibiting mirror image symmetry about said cylindrical axis and with $\cos \phi$ symmetry along a circular arc of said cylinder and with an arc angle of approximately 120°, the axial locations of the windings of the coils being selected to eliminate contributions to the (3,1) term of the spherical harmonic expansion of the axial component of the magnetic field in said cylindrical volume produced by said correction coil set.

* * * * *

UNITED STATES PATENT AND TRADEMARK OFFICE
CERTIFICATE OF CORRECTION

PATENT NO. : 4,581,580

DATED : April 8, 1986

INVENTOR(S) : Thomas A. Keim

It is certified that error appears in the above-identified patent and that said Letters Patent is hereby corrected as shown below:

Column 8, line 5, after "(", delete "1" and substitute therefor -- $\ell$ --.

Column 8, line 10, after "wherein" delete "1" and substitute therefor -- $\ell$ --.

Column 8, line 12, after "$\leq$" (second occurrence) delete "1" and substitute therefor -- $\ell$ --.

Signed and Sealed this

First Day of July 1986

[SEAL]

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,581,580
DATED : April 8, 1986
INVENTOR(S) : Thomas A. Keim

It is certified that error appears in the above-identified patent and that said Letters Patent is hereby corrected as shown below:

IN THE CLAIMS:

Col. 7, line 18, before the word "polarities", delete "select" and insert therefor -- selected --.

Col. 7, line 22, after "being" insert -- so --.

Col. 7, line 23, before "electrical" insert therefor -- that --.

Signed and Sealed this

Twelfth Day of August 1986

[SEAL]

Attest:

DONALD J. QUIGG

Attesting Officer

Commissioner of Patents and Trademarks